United States Patent [19]

Sera

[11] Patent Number: 4,554,126
[45] Date of Patent: Nov. 19, 1985

[54] METHOD FOR ENCAPSULATING SEMICONDUCTOR DEVICES

[75] Inventor: Michitoshi Sera, Yokohama, Japan

[73] Assignee: Tokyo Shibaura Denki Kabushiki Kaisha, Japan

[21] Appl. No.: 510,226

[22] Filed: Jul. 1, 1983

[30] Foreign Application Priority Data

Jul. 3, 1982 [JP] Japan .................................. 57-114799

[51] Int. Cl.$^4$ ............................ B29C 6/04; B29B 1/03
[52] U.S. Cl. .................................. 264/272.17; 29/588; 264/328.5; 264/328.17
[58] Field of Search ............. 264/272.17, 115, 328.17, 264/331.12, 331.15, 328.5; 29/588; 528/502

[56] References Cited

U.S. PATENT DOCUMENTS 3,659,821  5/1972  Sakamoto et al. .............. 264/272.17
4,370,292  1/1983  Yanase et al. .................. 264/272.17

FOREIGN PATENT DOCUMENTS 905623  7/1972  Canada ................................ 528/502

Primary Examiner—James Lowe
Attorney, Agent, or Firm—Finnegan, Henderson, Farabow, Garrett & Dunner

[57] ABSTRACT

A high-density resin tablet and a method for encapsulating semiconductor devices using the same, by which molded products free from voids may be obtained. The high-density resin tablet of the present invention may be obtained by compressing a thermosetting resin such as an epoxy resin at a pressure of 4 ton/cm$^2$ or more, and has a compressibility of 95% or more. The tablet of the present invention may be used in the same manner as the conventional tablets in multitablet molding and transfer molding method.

4 Claims, 4 Drawing Figures

METHOD FOR ENCAPSULATING SEMICONDUCTOR DEVICES

BACKGROUND OF THE INVENTION

I. Field of the Invention

The present invention relates to high-density resin tablets for encapsulating a semiconductor device, a method for manufacturing such tablets, and a method for encapsulating a semiconductor device using such tablets.

II. Description of the Prior Art

At present, transfer molding is widely adopted for plastic encapsulation of semiconductor devices. In transfer molding, a metal lower mold die is used which has a number of cavities and a concave portion called pot communicating therewith through runners. A lead frame at the outer periphery of a semiconductor device is placed on an edge of the cavity. An upper mold die having cavities and a through hole corresponding to the cavities and the pot, respectively, of the lower mold die is placed on the lower mold die. Thus, a semiconductor device is arranged in each space defined between corresponding cavities of the lower and upper mold dies. When a thermosetting resin is heated, it is generally plasticized and is thereafter cured. Accordingly, if a thermosetting resin tablet which is preheated by a high-frequency heater or the like is inserted in the pot of the mold die which is preheated to a predetermined temperature, the resin tablet in the pot is plasticized. When the plasticized thermosetting resin is fed out from the pot by means of a plunger, the resin reaches the cavities through the runners and covers the semiconductor devices in the cavities. When the resin is left to stand for a while it cures, thus encapsulating the semiconductor devices.

In the transfer molding method, however, the resin remained in the pot and the runners is discarded, so that the utilization efficiency is bad. To eliminate this disadvantage and to enable faster molding, multitablet molding method has been developed and used. This method also uses lower and upper mold dies. The lower mold die has a plurality of pots. In the vicinity of the each pot, a pair of cavities are formed such that they face each other with the pot between. The pair of cavities are communicated with the pot through thin and short grooves called gates. A lead frame of a semiconductor device is placed on the edge of each cavity. An upper mold die having cavities and through holes corresponding to the cavities and the pots, respectively, of the lower mold die is placed on the lower mold die. Thus, a semiconductor device is arranged in each space defined between corresponding cavities of the lower and upper mold dies. A thermosetting resin tablet which is not preheated is inserted into each pot through the through hole and the resin tablet is plasticized therein. After the resin is plasticized, it is pressed by a plunger, so that it is injected into the cavities with pressure. The resin is cured in the cavities and thus the semiconductor device is encapsulated. The pots of the lower mold die used in the multitablet molding method is smaller than that of in the transfer molding method. The distance between the pot and the cavity is shorter in the multitablet molding. As a result, the amount of discarded resin is smaller and the injection time is shorter in the multitablet molding. Further, in the multitablet molding, a fast-curing resin may be used so that the quicker molding may be attained when compared with the transfer molding method.

In conventional molding, a thermosetting resin is formed into tablets by a tableting machine so as to allow easy handling of the resin during encapsulation or transportation. Thus, the resin need only be formed into tablets which have a hardness which does not allow chipping or cracking. Accordingly, the resin is conventionally formed into tablets at a pressure of about 0.5 to 1.0 ton/cm$^2$. The compressibility of the obtained resin tablets is about 77 to 84%, where the compressibility is given by Compressibility (%) = tablet density/density of molded product Since the density of the molded product remains the same for each type of thermosetting resin, the tablet density increases with an increase in the compressibility. In other words, the higher the compressibility, the greater force the resin is pressed together.

However, when the cross-section of a molded product obtained by conventional molding is examined, inner voids of about 0.1 mm size can be detected. Some have several voids of 0.5 to 1.0 mm. The occurrence of the voids is severer in the multitablet molding method in which fast-curing resin is usually used. The outer surface of a molded product also has voids. Especially, in the multitablet molding method, an outer void called "snake eye" is often appeared in the vicinity of the gate of the mold die. Such a void not only degrades the outer appearance of the device, but also the reliability of the resin-encapsulated semiconductor device, especially its resistance to thermal shock and to humidity. When the number of inner voids increases, disconnection of the bonding wire connecting the lead frame of the device and pellet elements occurs more frequently.

SUMMARY OF THE INVENTION

It is an object of the present invention to provide a method of resin encapsulation of a semiconductor device, which minimizes the formation of voids.

It is another object of the present invention to provide a method for resin encapsulation of semiconductor devices, which results in a high manufacturing yield.

It is still another object of the present invention to provide high-density resin tablets which may be used in the above method.

It is still another object of the present invention to provide a method for manufacturing the high-density resin tablets.

The present inventor has carried out extensive studies and have found that when resin tablets having a compressibility of 95% or more and obtained from a thermosetting resin powder at a tableting pressure of 4 ton/cm$^2$ or higher are used in conventional molding methods, the number of voids in a resultant molded product may be significantly reduced. Resin tablets having such a high compressibility have never previously been used in molding, not to mention in resin encapsulation of semiconductor devices. The present invention is based on this finding.

The present invention thus provides high-density tablets of a thermosetting resin, which have a compressibility of 95% or more.

The present invention further provides a method for manufacturing such high-density resin tablets, which includes the step of compressing a thermosetting resin powder at a pressure of 4 ton/cm² or higher.

The present invention also provides a method for resin encapsulation of a semiconductor device, comprising the steps of:

providing a lower mold die having a flat portion and a cavity;

providing an upper mold die having a flat portion and a cavity corresponding to the flat portion and the cavity of the lower mold die respectively;

fixing the semiconductor device between the cavities of the lower and upper mold dies;

plasticizing high-density tablets of a thermosetting resin and having a compressibility of 95% or more;

injecting the plasticized thermosetting resin into a space defined between the cavities of the lower and upper mold dies; and curing the injected resin.

When a semiconductor device is encapsulated by the method of the present invention, the formation of voids is significantly reduced. This leads to an improvement in reliability of the manufactured semiconductor devices. The method of the present invention also allows high-speed injection and curing of a plasticized fast-curing resin in the multitablet molding method, resulting in a higher working efficiency. Thus, it is especially effective to apply the tablets of the present invention to the multitablet molding method.

DETAILED DESCRIPTION OF THE PREFERRED EMBODIMENTS

High-density tablets for resin encapsulation of a semiconductor device according to the present invention is made of a thermosetting resin and have a compressibility of 95% or more and preferably of 97% or more. The thermosetting resin may be any conventional resin used for resin tablets, but generally an epoxy resin.

Figure 1:
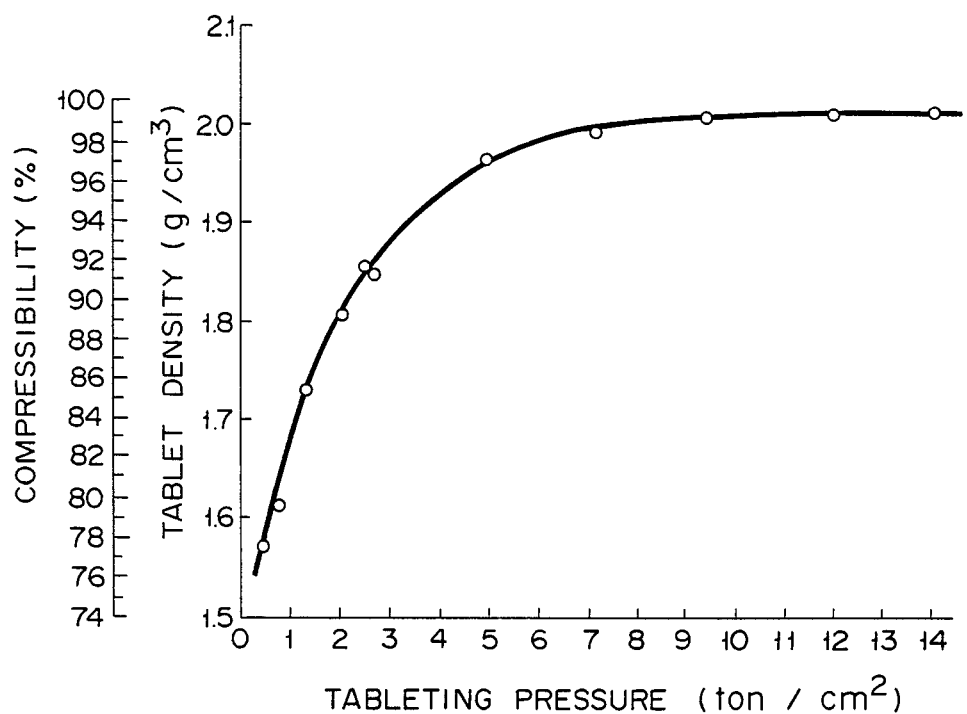
FIG. 1 is a graph showing the compressibility (%) and the tablet density (g/cm³) as a function of tableting pressure (ton/cm²)

Resin tablets having such a high compressiblity according to the present invention may be obtained by compressing a resin powder under high pressure using a tableting machine. Needless to say, as the tableting pressure increases, the compressibility of the resultant resin tablets increases. FIG. 1 shows the relationships between the tableting pressure, the tablet density, and the compressibility. It may be seen from the graph shown in FIG. 1 that tablets having a compressibility of 95% may be obtained by tableting a resin powder at a tableting pressure of 4 ton/cm², and tablets having a compressibility of 97% may be obtained by tableting a resin powder at a tableting pressure of 5 ton/cm².

The method for resin encapsulation according to the present invention employs high-density resin tablets as described above in conventional molding methods. In other words, the method for resin encapsulation according to the present invention is substantially the same as conventional molding methods except that the specified high-density resin tablets are used. However, according to the method of the present invention, some process parameters may be improved as described later.

Figure 2:
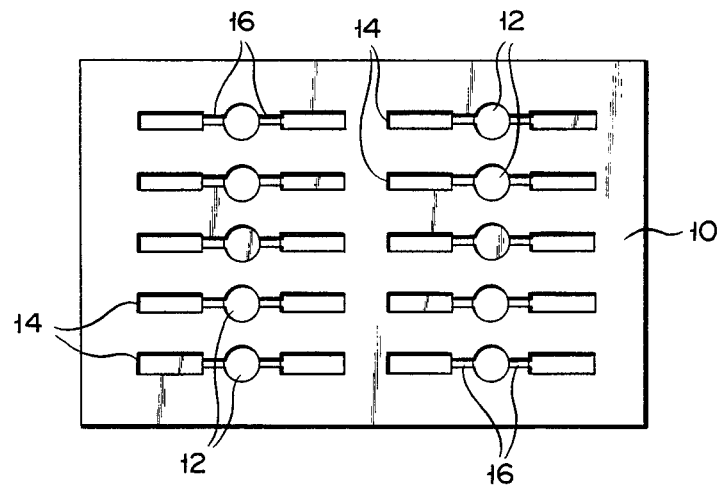
FIG. 2 is a plan view of a lower mold die used in multitablet molding.

FIG. 2 shows a metal lower mold die 10 which may be used in the multitablet molding method. The lower mold die 10 has a plurality of pots 12 (recessed portion) in which resin tablets are to be placed later. A pair of cavities 14 are formed at the sides of each pot 12. Each cavity 14 is connected to the corresponding pot 12 through a gate 16 (small channel). The remaining portion of the lower mold die 10 is flat. An upper mold die 18 (see FIG. 3) has cavities 20 at positions corresponding to those of the cavities 14 in the lower mold die 10. The upper mold die 18 also has through holes 22 at positions corresponding to those of the pots 12 in the lower mold die 10. The remaining portion of the upper mold die 18 is also flat.

Figure 3:
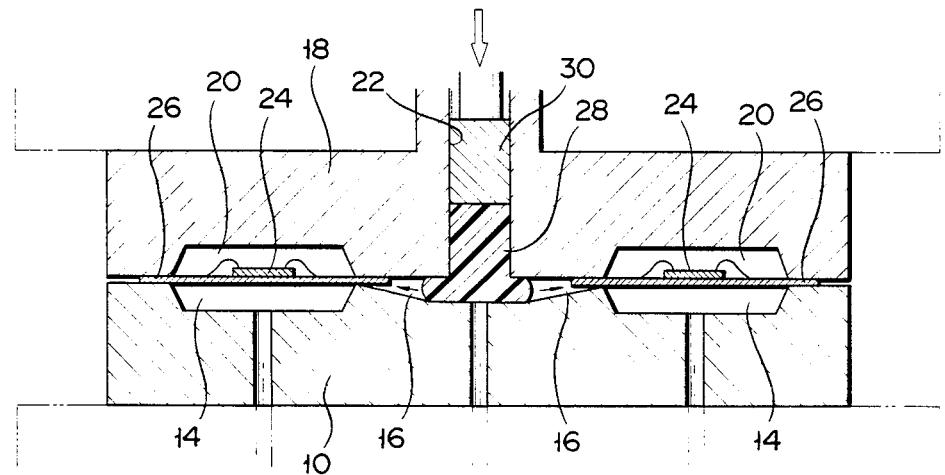
FIG. 3 is a sectional view for explaining multitablet molding.

The procedures for resin encapsulation of semiconductor devices by multitablet molding method will now be described with reference to FIG. 3. The lower and upper mold dies 10 and 18 are preheated to a temperature of about 180° C. A semiconductor device 24 generally has a lead frame 26 at its periphery. The lead frame 26 of each semiconductor device 24 is rested on the edge of the corresponding cavity 14 of the lower mold die 10. The upper mold die 18 is then placed on the lower mold die 10, so that the semiconductor devices 24 are fixed in the spaces between the cavities 14 of the lower mold die 10 and the cavities 20 of the upper mold die 18. Resin tablets 28 which are not preheated are then placed in the pots 12 of the lower mold die 10 via the through holes 22. According to the method of the present invention, the resin tablets 28 are made of a thermosetting resin such as an epoxy resin and have a compressibility of 95% or more. Preferably, fast-curing resin is used. Since the lower and upper mold die 10 and 18 are preheated to a temperature of about 180° C., the resin tablets 28 are heated by the heat transferred from the molds and are plasticized. When the resin tablets 28 have been plasticized, plungers 30 are moved in the direction indicated by an arrow in FIG. 3 so as to press the plasticized resin downward in each pot 12. As a result, the resin is injected into the cavities 14 and 20 through the gates 16 and covers the semiconductor devices 24. The resin injection time is generally 10 seconds or less, and the injection pressure is generally 80 to 120 kg/cm² (especially 80 to 100 kg/cm²). The resin which has covered the semiconductor devices 24 is cured by the heat from the lower and upper mold dies 10 and 18, thus encapsulating the semiconductor devices 24. The curing time is generally about 20 seconds or less if fast-curing resin is used, and is 90 to 180 seconds in the case of other resin.

It is more effective to use the resin tablet of the present invention in the multitablet molding method in which the occurrence of voids is severer. Needless to say, however, the resin tablet of the present invention may be used in the transfer molding method.

Figure 4:
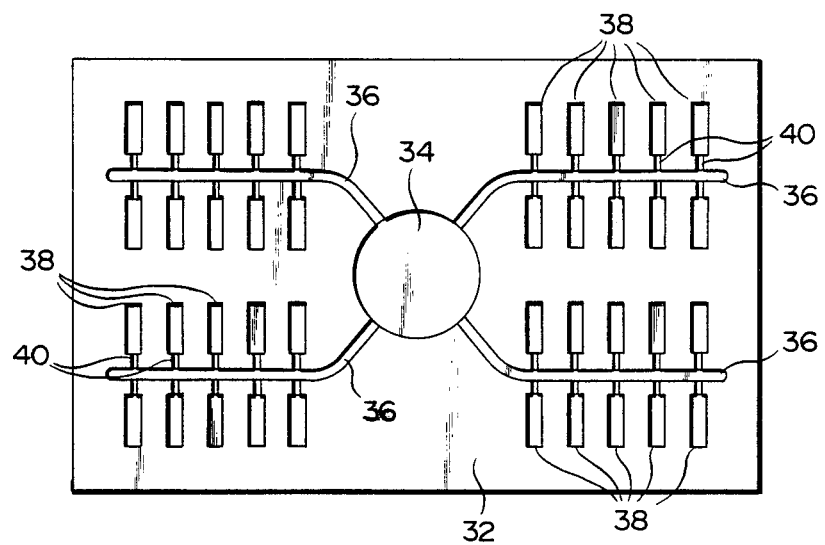
FIG. 4 is a plan view of a lower mold die used in transfer molding.

FIG. 4 shows a lower mold die which is used in the transfer molding method. Referring to FIG. 4, a lower mold die 32 has at its center a pot 34 in which a resin tablet is to be placed later. A plurality of grooves 36 (4 grooves in this case) which are so-called "runners" extend from the pot 34. A number of cavities 38 extend at sides of each runner 36. Each cavity 38 is connected to the corresponding runner 36 through a gate 40 (small channel). The remaining portion of the lower mold die 32 is flat. An upper mold die (not shown) has cavities at positions corresponding to those of the cavities 38 in the lower mold die 32. The upper mold die also has a through hole at a position corresponding to that in the pot 34 in the lower mold die 32. The remaining portion of the upper mold die is also flat.

In the transfer molding method, the lower and the upper mold dies are preheated to a temperature of about 175° C. Each semiconductor device is fixed in a space defined by the cavities of the lower and upper mold dies. In the transfer molding, the resin tablet is preheated to a temperature of 80° to 90° C. since it is larger than those used in the multitablet molding. The resin tablet is placed in the pot via the through hole, and is plasticized therein. The plasticized resin is pressed by a plunger and the resin is injected into the cavities through the runners and the gates to cover the semiconductor devices. The resin is cured there and thus the semiconductor devices are encapsulated. In the transfer molding method, the cure time is usually 90 to 180 seconds, the injection time is usually about 20 seconds, and the injection pressure is usually 80 to 120 kg/cm$^2$ (especially 80 to 100 kg/cm$^2$).

EXAMPLES 1 TO 5

Fast-curing epoxy resin tablets having 10 different compressibilities as shown in Table 1 below were used for resin encapsulation of semiconductor devices by multitablet molding method. The molding was performed at a mold temperature of 180° to 185° C., an injection time of 10 seconds, a injection pressure of 110 kg/cm$^2$, and a molding time of 20 seconds. Semiconductor devices were also encapsulated using the transfer molding method employing comparable conditions described above. Encapsulated semiconductor devices were examined for the presence of any inner void having a diameter of 0.3 mm or more. The results obtained are also shown in Table 1 below.

TABLE 1

Presence of Inner Voids Having Diameter of 0.3 mm or more

|  | Compressibility (%) | Tableting pressure (ton/cm$^2$) | Multi-tablet molding | Transfer molding |
|---|---|---|---|---|
| Comparative Example 1 | 78.1 | 0.6 | Present | Present |
| Comparative Example 2 | 79.9 | 0.8 | Present | Present |
| Comparative Example 3 | 85.8 | 1.2 | Present | Present |
| Comparative Example 4 | 89.3 | 2.0 | Present | Present |
| Comparative Example 5 | 91.4 | 2.6 | Present | Present |
| Example 1 | 97.4 | 4.7 | Absent | Absent |
| Example 2 | 98.4 | 7.0 | Absent | Absent |
| Example 3 | 99.5 | 9.3 | Absent | Absent |
| Example 4 | 99.7 | 11.7 | Absent | Absent |
| Example 5 | 99.8 | 14.0 | Absent | Absent |

With the resin encapsulated semiconductor devices obtained using the tablets of Examples 1 to 5, no outer void (so-called snake eye), which is conventionally formed in the vicinity of the gate, was observed.

EXAMPLE 6

Resistance to thermal shock of the resin encapsulated semiconductor devices obtained using the tablets of Comparative Example 2 and Example 2 was tested using the Thermal Cycle Test (TCT). The conditions of the test were a cycle of −65° C., 30 min→ambient temperature, 5 min→200° C., 30 min→ambient temperature, 5 min→−65° C., 30 min. This heat cycle was repeated 20, 40 and 60 times for each sample, and the ratio of defective encapsulated semiconductor devices due to the opening of bonding wire was measured. The obtained results are shown in Table 2 below. The number of samples was 100 for each number of cycles repeated.

TABLE 2

| | TCT Defective Ratio | |
|---|---|---|
| Number of cycles | Comparative Example 2 (%) | Example 2 (%) |
| 20 | 2.5 | 0.3 |
| 40 | 25 | 6 |
| 60 | 72 | 29 |

EXAMPLE 7

The defective ratio of the encapsulated semiconductor devices obtained under the conditions given above was determined by the Pressure Cooker Test (PCT) using the tablets of Comparative Example 2 and Example 2. The defect in PCT is mainly due to the corrosion of the aluminum wiring of the semiconductor element by the moisture. The test conditions were 127° C. and 2.5 atm. The test was performed by placing the resin encapsulated semiconductor devices under these conditions for each of 500, 1,000 and 2,000 continuous hours, and then determining the defective ratio of the devices. The obtained results are shown in Table 3 below. The number of samples for each test time was 50.

TABLE 3

| | PCT Defective Ratio | |
|---|---|---|
| Test time (hrs) | Comparative Example 2 (%) | Example 2 (%) |
| 500 | 4 | 1.6 |
| 1,000 | 16 | 7 |
| 2,000 | 50 | 30 |

EXAMPLE 8

Using the tablets of Comparative Example 2 and Example 2, semiconductor devices were encapsulated under the same conditions as described above, and under the same conditions as described above except that the molding pressure was 40 kg/cm$^2$. The encapsulated semiconductor devices were examined for the presence of inner voids having a diameter of 0.1 mm or more, and the ratio of devices having such inner voids to those having no such voids was determined. The number of samples for each molding pressure was 100. The results obtained are shown in Table 4.

TABLE 4

| Ratio of Formation of Inner Voids Having Diameter of 0.1 mm or more | | |
|---|---|---|
| Molding pressure (kg/cm$^2$) | Comparative Example 2 (%) | Example 2 (%) |
| 110 | 60 | 24 |
| 40 | 79 | 24 |

It may be seen from Table 4 above that even if the molding pressure is decreased to about ⅓, the ratio of formation of inner voids does not increase. Thus, Table 4 confirms that when the tablets of the present invention are used, the range of molding pressure is widened significantly.

EXAMPLE 9

Using the tablets of Comparative Example 2 and Example 2, semiconductor devices were encapsulated under various plunger falling speeds and the ratio of formation of inner voids having a diameter of 0.1 mm or more was examined. The number of samples tested for each plunger falling speed was the same as in Example 8. It is noted that the plunger falling speed adopted in conventional molding method is 2.5 mm/sec or less. The results are shown in Table 5 below.

TABLE 5

| Plunger falling speed (mm/sec) | Ratio of Formation of Inner Voids Having Diameter of 0.1 mm or more | |
|---|---|---|
| | Comparative Example 2 (%) | Example 2 (%) |
| 2.5 | 60 | 24 |
| 5.0 | 70 | 24 |

It may be seen from Table 5 above that when the resin tablets of the present invention are used, the ratio of formation of inner voids does not increase even if the plunger falling speed is increased to 5.0 mm/sec, which is twice that of conventional molding. Accordingly, when the tablets of the present invention are used, the injection time may be reduced to half that of conventional molding methods, thus improving working efficiency.

The relationship between the compressibility of the resin tablets and the ratio of occurrence of inner voids having diameters of 0.3 mm or more in the molded products was also tested. As a result, the ratio of occurrence was determined to be below 0.1% for a compressibility of 97 to 100%; 0.1 to 0.5% for a compressibility of 95 to 97%; and 0.5% or more for a compressiblity of less than 95%. Accordingly, the compressibility of the tablets is preferably 97% or more. However, in practice, no problems will develop provided the compressibility is 95% or more.

What is claimed is:

1. A method for resin encapsulation of a semiconductor device, comprising the steps of:
   providing a lower mold die having a flat portion and a cavity;
   providing an upper mold die having a flat portion and a cavity corresponding to the flat portion and the cavity of the lower mold die respectively;
   fixing the semiconductor device between the cavities of the upper and lower mold dies;
   plasticizing a high-density tablet of a thermosetting resin having a compressibility of not less than 95%;
   injecting the plasticized resin into a space defined between the cavities of the upper and lower mold dies to cover the semiconductor device; and
   curing the injected resin.

2. A method for resin encapsulation of a semiconductor device, comprising the steps of:
   providing a lower mold die having a channel, a first cavity communicating with one end of the channel, and a pot communicating with the other end of the channel;
   providing an upper mold die having a second cavity at a position corresponding to a position of the first cavity and also having a through hole at a position corresponding to a position of the pot;
   placing a lead frame around an outer periphery of the semiconductor device on an edge of the first cavity of the lower mold die;
   fixing the semiconductor device in a space defined between the cavities of the upper and lower mold dies when the upper mold die is placed on the lower mold die;
   inserting a high-density tablet made of a thermosetting resin and having a compressibility of not less than 95% into the pot through the through hole;
   heating and plasticizing the tablet;
   pressing the plasticized thermosetting resin in the pot by means of a plunger through the through hole, thereby injecting the plasticized thermosetting resin into the space defined between the first and second cavities in which the semiconductor device is fixed; and
   heating and curing the thermosetting resin injected into the space.

3. The method according to claim 2, wherein heating for plasticizing the tablet and heating for curing the thermosetting resin are performed by preheating the upper and lower mold dies.

4. A method for resin encapsulation of a semiconductor device comprising the steps of:
   providing a lower mold die having a plurality of pots, a plurality of cavities each communicating with each pot through a channel;
   providing an upper mold die having a plurality of through holes and cavities corresponding to the pots and cavities of the lower mold die;
   placing a lead frame around an outer periphery of the semiconductor device on an edge of each of the cavities of the lower mold die;
   fixing the semiconductor device in each space defined between the cavities of the upper and lower mold dies when the upper mold die is placed on the lower mold die;
   inserting a high-density tablet made of a thermosetting resin and having a compressibility of not less than 95% into each pot through each through hole;
   heating and plasticizing the tablet;
   pressing the plasticized thermosetting resin in each pot by means of a plunger through each through hole, thereby injecting the plasticized thermosetting resin into each space defined between the cavities of the upper and the lower mold dies, in which the semiconductor device is fixed; and
   heating and curing the thermosetting resin injected into each space.

* * * * *